United States Patent [19]
De Los Santos

[11] Patent Number: 5,818,309
[45] Date of Patent: Oct. 6, 1998

[54] MICROWAVE ACTIVE NOTCH FILTER AND OPERATING METHOD WITH PHOTONIC BANDGAP CRYSTAL FEEDBACK LOOP

[75] Inventor: Hector J. De Los Santos, Inglewood, Calif.

[73] Assignee: Hughes Electronics Corporation, Los Angeles, Calif.

[21] Appl. No.: 771,609

[22] Filed: Dec. 21, 1996

[51] Int. Cl.[6] .............................. H03H 7/00; H01P 1/20
[52] U.S. Cl. ........................................... 333/176; 333/202
[58] Field of Search ..................................... 333/176, 202, 333/219, 219.1, 235; 331/96, 117 D

[56] References Cited

U.S. PATENT DOCUMENTS

| | | | |
|---|---|---|---|
| 4,649,354 | 3/1987 | Khanna | 333/117 FE X |
| 4,688,005 | 8/1987 | Kipnis | 333/117 D X |
| 4,920,563 | 4/1990 | Lemaire | 333/176 X |
| 5,379,009 | 1/1995 | Ishikawa et al. | 333/202 X |
| 5,389,943 | 2/1995 | Bommer et al. | 333/235 X |
| 5,471,180 | 11/1995 | Brommer et al. | 333/219.1 X |

OTHER PUBLICATIONS

Atia et al., "Narrow–Bandpass Waveguide Filters", *IEEE Transactions on Microwave Theory and and Techniques*, vol. MTT–20, No. 2, Apr. 1972, pp. 258–265.

Levy et al., "A History of Microwave Filter Research, Design, and Development", *IEEE Transactions on Microwave Theory and Techniques*, vol. MTT–32, No. 9 Sept. 1984, pp. 1055–1067.

Joannopoulos et al., *Photonic Crytals–Molding the Flow of Light*, Princeton University Press, 1995, pp. 40–43, 94–97 and 121–126.

Yablonovitch, "Photonic band–gap structures", *Journal of the Optical Society of America B*, vol. 10, No. 2, Feb. 1993, pp. 283–295.

*Primary Examiner*—Seungsook Ham
*Attorney, Agent, or Firm*—Elizabeth E. Leitereg; Terje Gudmestad; Michael W. Sales

[57] ABSTRACT

An active microwave notch filter is formed by connecting a photonic bandgap crystal (PBC) in a feedback loop around a microwave amplifier. The PBC has an attenuation bandgap which establishes a frequency range of preferential amplification. Frequency selectivity can be achieved by applying signals to the dielectric members which form the PBC to vary their dielectric constants, and thus the bandgap, or by selecting among multiple parallel PBCs. Antennas are provided to transduce the electrical input to the PBC into electromagnetic radiation, and then back to an electrical signal after the radiation has been filtered by the PBC.

21 Claims, 3 Drawing Sheets

MICROWAVE ACTIVE NOTCH FILTER AND OPERATING METHOD WITH PHOTONIC BANDGAP CRYSTAL FEEDBACK LOOP

BACKGROUND OF THE INVENTION

1. Field of the Invention

This invention relates to active notch filters and operating methods, particularly for microwave applications.

2. Description of the Related Art

The advent of wireless communications including satellite systems has led to a significantly increased use of the communications frequency spectrum, especially in the microwave region. Electromagnetic congestion has intensified the need for high performance, low cost, narrow bandpass (notch) filters possessing good frequency selectivity and small insertion loss. Microwave filters in general are discussed in Atia et al., "Narrow-Bandpass Waveguide Filters", *IEEE Transactions on Microwave Theory and Techniques,* Vol. MTT-20, No. 4, April 1972, pages 258–265, and in Levy et al., "A History of Microwave Filter Research, Design, and Development", *IEEE Transactions on Microwave Theory and Techniques,* Vol. MTT-32, No. 9, September 1984, pages 1055–1067.

Waveguide structures with multiple cross-coupled cavities are presently used as filters. However, these structures have a number of disadvantages. For one, they tend to be lossy, since the various cavities are coupled together by irises, and they are also relatively expensive. Since they include mechanical components post-fabrication tuning is required. They are also rather limited in their amount of rejection contrast, allowing an undesirably high level of noise to propagate through. Another important limitation of such filters is that they are not frequency selective. For example, if they pass a fundamental frequency $\omega$, they will generally also pass the harmonics ($2\omega$, $3\omega$, etc.) as well. On the other hand, the frequency at which they operate is fixed, which limits their versatility.

Filtering with a waveguide structure is typically followed by amplification of the filtered signal. In addition to the limitations of waveguide filters just discussed, amplifying the signal after filtering reduces the sensitivity of the signal acquisition operation.

Interest in photonic bandgap structures has also grown in recent years. Such structures operate in a manner analogous to crystals with periodic lattice structures, and crystal terminology is conventionally used to describe them. While photonic bandgap structures are actually mechanical devices, the customary crystal terminology is used herein where applicable to describe their structure and operation. They are discussed in Joannopoulos et al., *Photonic Crystals-Molding the Flow of Light,* Princeton University Press, 1995, pages 40–43, 94–97 and 121–126, and in Yablonovitch, "Photonic band-gap structures", *Journal of the Optical Society of America B,* Vol. 10, No. 2, February 1993, pages 283–295.

A photonic bandgap crystal (PBC) is a periodic or nearly periodic structure Which supports the propagation of electromagnetic radiation except at certain bandgap frequencies. PBCs are typically macroscopic devices constructed from dielectric material, although metallic components are sometimes used. FIG. 1 is a simplified plan view of a conventional PBC which has a lattice constant 1 and includes dielectric members 12 such as rods of diameter d. Further details of a typical PBC are provided in U.S. Pat. No. 5,386,215 to Brown, issued Jan. 31, 1995, the contents of which are incorporated herein by reference. The rods are generally disposed within a non-conductive, high dielectric substrate material that is not shown in the accompanying drawings for convenience of illustration.

FIG. 2 presents a dispersion relation which illustrates how electromagnetic transmission through a defect-free PBC such as that shown in FIG. 1 varies with frequency; frequencies within the bandgap 14 do not propagate through the crystal but instead are reflected from it. This property of PBCs stems from their periodicity, and does not depend upon features at the atomic level or upon any absorption process. Like semiconductor crystals, PBCs can be regarded as periodic or nearly periodic arrays of unit cells 16 with each cell encompassing a respective rod 12.

The frequency response of a PBC depends upon a number of parameters, such as the dielectric constant of the material used, the shape and position of the objects from which the PBC is constructed and their separation from each other, as well as the presence and nature of any defects residing within the PBC. As discussed in the Yablonovitch article, adding dielectric material to or removing it from a defect-free PBC (e.g. removing a unit cell 16 or adding an additional rod 17 between a group of unit cells) alters the translational symmetry of the dielectric structure and creates defects analogous to donor and acceptor atoms in semiconductors. This results in an allowed frequency passband 18 within the bandgap, like that illustrated in FIG. 3. However, even if they were used as a pre-amplification filter, the resulting notch filter would still suffer from the reduced sensitivity problem mentioned above.

SUMMARY OF THE INVENTION

The present invention uses one or more PBC in an amplifier feedback loop to produce a frequency selectable active microwave notch filter. The amplifier preferably employs microwave compatible elements such as field-effect transistors (FETs) circuit or a high electron mobility transistors (HEMTs). Because the PBC is in the amplifier feedback path, frequencies which it more strongly attenuates are preferentially amplified by the amplifier. More than one PBC can be connected across the amplifier to form multiple feedback loops that can be switched in and out of the circuit to adjust its frequency response.

Unlike conventional microwave filters, the PBC has a dispersion relation which is aperiodic, so that harmonic frequencies of the fundamental do not generally pass through it, thereby insuring that the notch filter will operate stably. The PBC, and thus the notch filter, can be tailored for specific frequencies by an appropriate choice of dielectric material, the shape and size of the dielectric members, and the location, number and nature of any defects within the PBC. In addition, the circuit's frequency response can be actively varied, such as by applying a voltage across the dielectric members, to alter the PBC's dispersion relation.

Further features and advantages of the invention will be apparent to those skilled in the art from the following detailed description, taken together with the accompanying drawings.

DETAILED DESCRIPTION OF THE INVENTION

As shown in the accompanying drawings, the present invention is designed for frequency selective amplification of electrical signals and includes a PBC connected in the feedback loop of an amplifier, preferably a microwave amplifier. The PBC together with the amplifier form an active notch filter in which filtering and amplification occur simultaneously, thereby greatly enhancing its signal sensitivity. The notch filter also obtains the other benefits of PBCs, such as frequency selectivity, modular construction, low weight and the elimination of tuning during fabrication.

Figure 4:
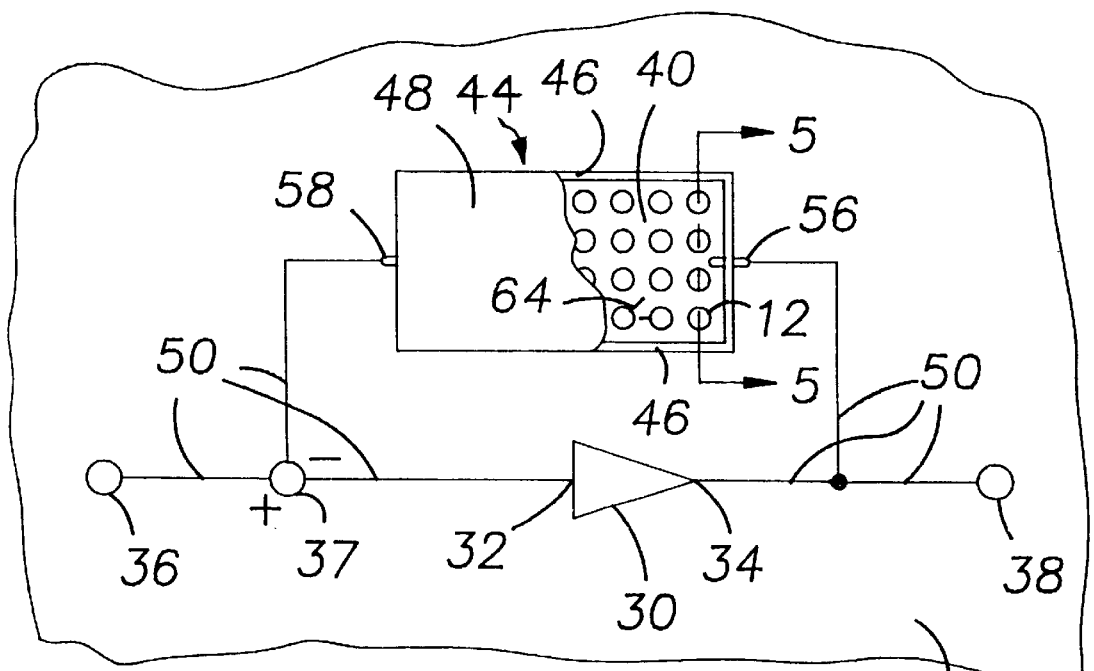
FIG. 4 is an illustrative schematic diagram of one embodiment of the invention in which an active notch filter is implemented by a PBC in the feedback loop of an amplifier.

One embodiment, shown in FIG. 4, includes an amplifier 30, preferably a microwave amplifier such as an FET or a HEMT, that has an input and output 32 and 34. FET amplifiers are discussed in J. S. Bharj, "17 GHz Low Noise GaAs FET Amplifier", *Microwave Journal,* pages 121–127, October 1994. An input terminal 36 which receives the input to the notch filter is connected to the positive input of a difference node 37, the output of which is connected to the amplifier input 32, while the amplifier output 34 is connected to an output terminal 38. A PBC 40 is connected in a feedback loop across the amplifier's output and the negative input to difference node 37, resulting in an amplifier input signal that is the difference between the signal at input terminal 36 and the feedback signal.

Figure 5:
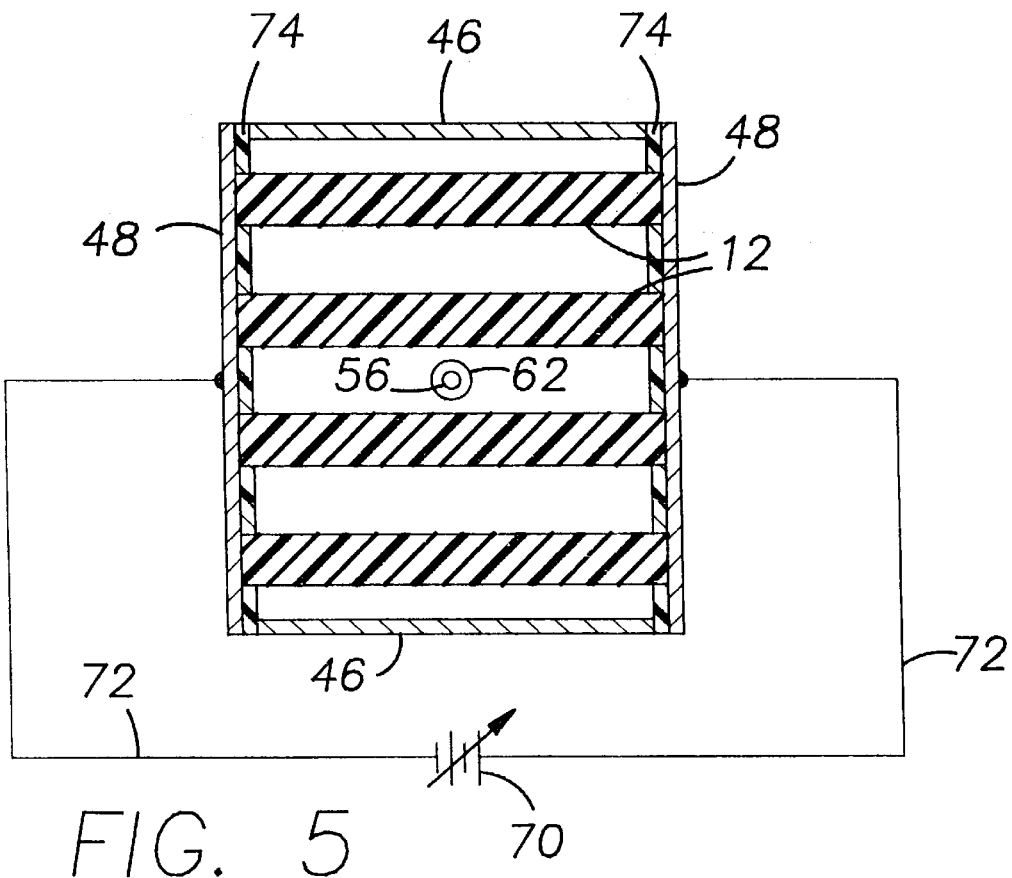
FIG. 5 is a sectional view taken along section line 5—5 of FIG. 4, combined with a schematic diagram of a voltage source that modifies the filter's frequency response.

PBC 40 preferably includes dielectric members 12 such as rods that are located within a waveguide-like cavity 44. The rod material and relative positions and spacings are selected in a known manner to produce at least one frequency bandgap within which signals are substantially attenuated. As shown in FIGS. 4 and 5, the cavity 44 preferably includes metallic walls 46 and metallic cover plates 48. The electrical connections to the amplifier and PBC are preferably made by metallic microstrip lines 50 disposed on an underlying alumina substrate 49.

The amplifier's output 34 propagates along one of the microstrip lines 50 to the PBC 40 and reaches an antenna 56 which protrudes into the PBC cavity 44 through one of the cavity's walls 46. The antenna 56 serves as a wave launcher for signals from the amplifier 30, and is preferably located in the same plane as the microstrip lines 50. A second antenna 58 is located at the other end of the cavity 44 and receives electromagnetic waves which propagate through the PBC 40. As shown in FIG. 5, the antennas 56 and 58 are surrounded by bushing insulators 62 which electrically insulate them from the cavity's metallic walls 46. Antennas 56 and 58 are connected to respective microstrip lines 50. Alternately, the microstrip lines 50 can be fed through the insulators 62 directly into the cavity 44 to directly launch electromagnetic waves into and receive radiation from the PBC 40.

Figure 2:
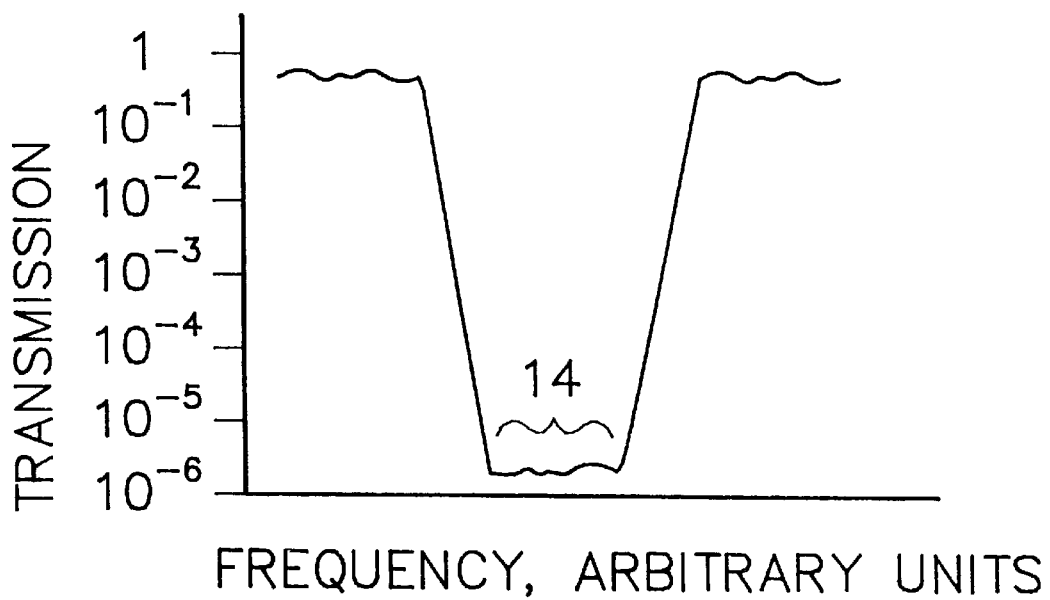
FIG. 2 is a plot of a dispersion relation that is representative of a conventional defect-free PBC.

Signals at frequencies that propagate from antenna 56 through the PBC 40 are returned to the negative input to difference node 37, where they subtract from the input signal. With signals at frequencies that do not propagate through the PBC, on the other hand, the signal level at the negative input to difference node 37 will be essentially zero and the original input signal at terminal 36 will continue on to the amplifier substantially unimpaired. If $G_o$ is the open loop gain of the amplifier 30 and T is the device's feedback factor, the closed loop gain $G_{c1}$ of the device for small signal levels is given by the expression $$G_{c1}=G_o/[1+TG_o] \quad (1)$$

as discussed in "The Circuits and Filters Handbook," W. Chen, Ed., pages 802–3, 1995. T is determined by the transmission response of the PBC 40, and is represented by a function such as those illustrated in FIGS. 2 and 3. In the limit at which $G_o$ is very large, $G_{c1}$ can be approximated as 1/T.

Figure 3:
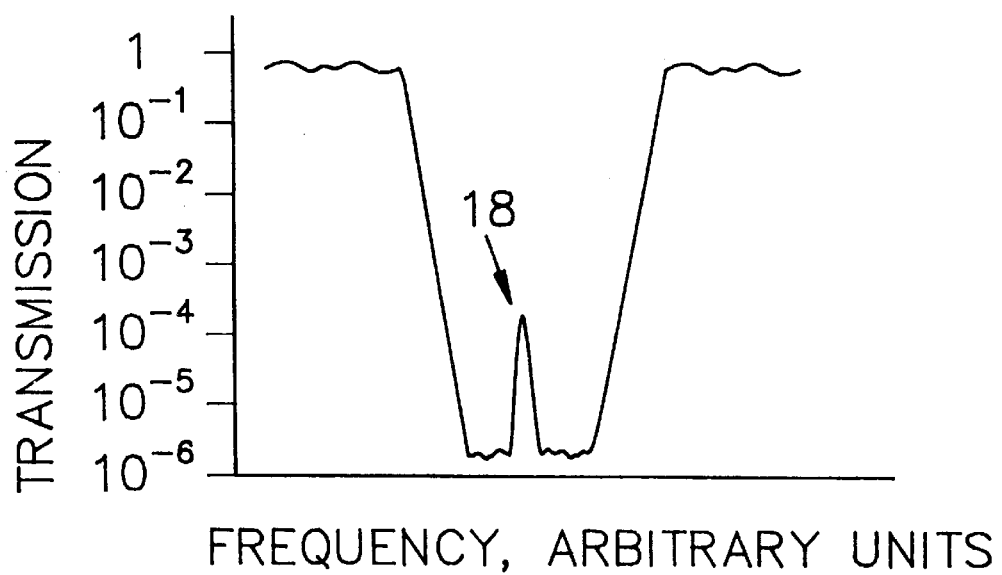
FIG. 3 is a plot of a dispersion relation that is representative of a convention PBC to which one or more defects have been added.

The significance of equation (1) and its approximation for large $G_o$ is that the notch filter preferentially amplifies frequencies that are more strongly attenuated by the PBC 40, e.g. those frequencies falling within its bandgap. Frequencies that are substantially transmitted by the PBC 40, on the other hand, will not be as strongly amplified. For example, the T functions represented by FIGS. 2 and 3 differ in that FIG. 3 contains the passband 18 within the bandgap 14. Consequently, when a PBC corresponding to FIG. 3 is used in the device, frequencies falling within the passband 18 will be preferentially transmitted by the PBC 40 compared with other frequencies within the bandgap 14. The PBC 40 thus functions as a filter, and the overall circuit as a frequency selective active notch filter whose output depends upon the frequency characteristics of the PBC.

Figure 1:
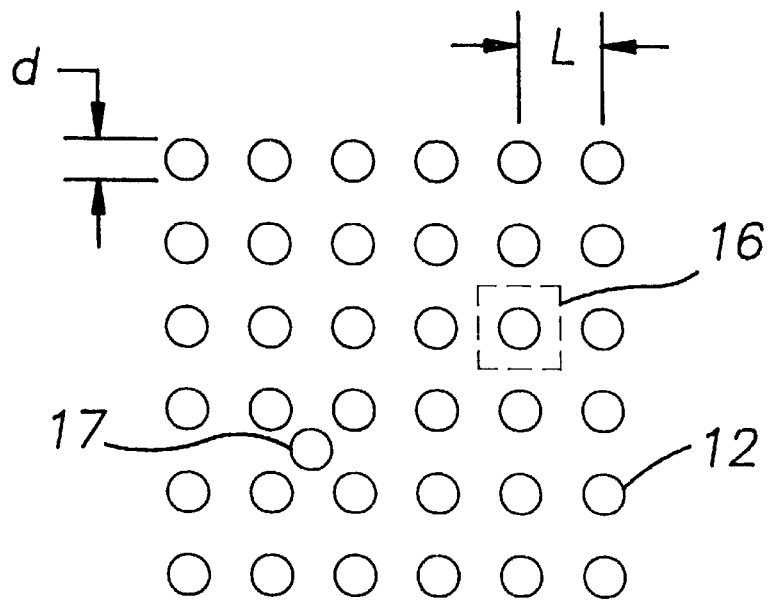
FIG. 1 is a plan view of a convention PBC.

The type of dielectric material used, the shape and size of the rods 12 and their separation from each other, and the nature, number and position of any defects within the PBC 40, can be tailored for specific frequency amplification requirements. Physical defects can be introduced into the PBC 40 by inserting one or more additional rods 17 into the periodic rod lattice as illustrate in FIG. 1 by removing one or more of the lattice rods 12, or by connecting one or more switches 64 between rods, the switches preferably being characterized by high isolation and low loss. Closing a switch 64 disturbs the periodicity of the PBC 40 and is equivalent to introducing a defect, thereby altering the PBC's T factor.

It is also possible to actively vary the T of a given PBC by applying a voltage across the rods 12 to change their dielectric constant. Increasing the dielectric constant moves the PBC bandgap to a lower frequency, while reducing the dielectric constant moves the bandgap to a higher frequency. Different dielectrics have different responses to an applied voltage. Some will not exhibit a significant change. In some, such as lead/lanthanum/zirconium, the dielectric constant will increase, while in others, such as barium strontium titanate, it will go down. The type of frequency tuning that takes place is established by selecting an appropriate dielectric material.

As shown in FIG. 5, a voltage source 70 connected to the metallic plates 48 via electrical lines 72 can be used for this purpose. The plates 48 contact the opposite ends of the rods 12, but are insulated by insulation regions 74 from the cavity's metallic walls 46, which are preferably grounded. Thus, when a voltage is applied to the rods 12, T is altered so that, for example, the frequency response of the device can be varied to nullify a moving interference signal.

The rod dielectric constants can also be varied in other ways. For example,. the dielectric constants of certain materials are photosensitive. Optical fibers could be introduced into the PBC cavity to illuminate the rods and thereby vary the filter's frequency response. Gallium arsenide and indium phosphide are examples of such photosensitive dielectric materials.

If a conventional microwave filter were to be placed in the feedback loop of the amplifier, it would be virtually impossible to achieve phase margin stability for the overall device, thus rendering it unstable. This is because conventional microwave filters have a periodic frequency response, i.e. if a fundamental frequency $\omega$ passes through the device, its harmonics ($2\omega$, $3\omega$, etc.) will generally pass through it as well. Because PBCs do not in general have a periodic frequency response, they can be combined with amplifiers to construct inherently stable notch filters.

Figure 6:
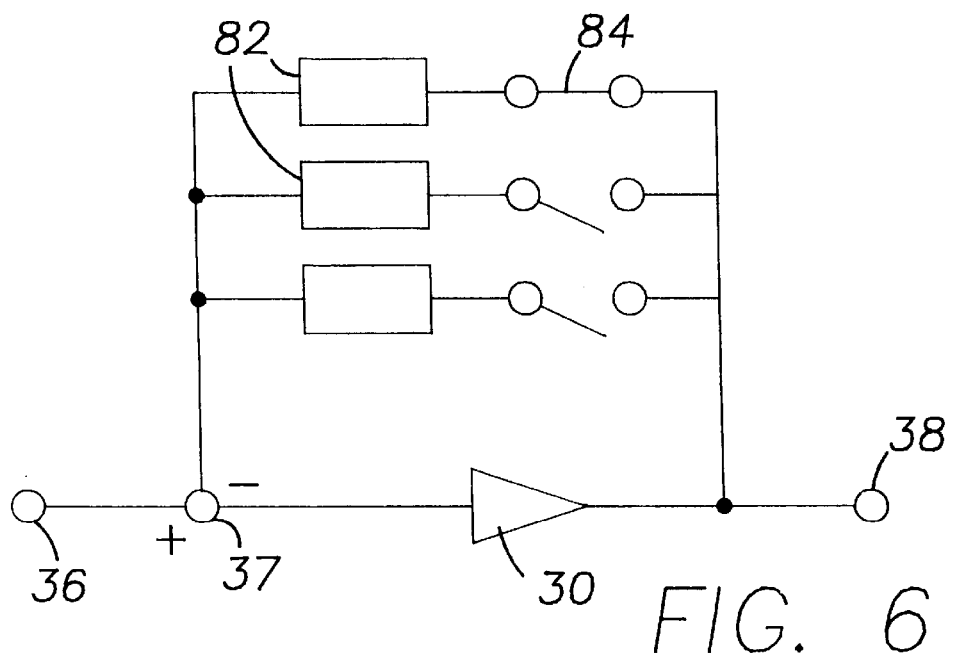
FIG. 6 is a schematic diagram showing a bank of PBCs that form respective feedback loops with a common amplifier to provide an extra degree of frequency selectability.

FIG. 6 shows another embodiment in which the amplifier 30 is connected through respective switches 84 with a bank of feedback PBCs 82 that have different respective T functions and bandgaps. The PBCs 82 form respective feedback loops, one or more of which can be selected by the user through an appropriate operation of the switches 84 to achieve a specific frequency response for the notch filter. This adds to the frequency range over which the filter can be tuned. The different PBCs 82 can provide a gross tuning capability, with each PBC having an adjustable frequency response as in FIG. 5 for fine tuning.

While particular embodiments of the invention have been shown and described, numerous variations and alternate embodiments will occur to those skilled in the art. Accordingly, it is intended that the invention be limited only in terms of the appended claims.

I claim:

1. An active notch filter, comprising:
   an amplifier with an input for receiving an electrical microwave input signal and an output; and
   a first photonic bandgap crystal (PBC) having an aperiodic dispersion relation connected in a feedback loop between said amplifier's input and output, said crystal having at least one frequency bandgap within which it substantially attenuates the transmission of electromagnetic radiation, said PBC's aperiodic dispersion relation causing said crystal to substantially pass the transmission of electromagnetic radiation at harmonic frequencies of said frequency bandgap so that the notch filter operates stably, said feedback loop causing said amplifier to impart a greater amplification to signals within said bandgap than to signals outside of said bandgap so that the amplifier and the PBC together filter and amplify the microwave input signal simultaneously thereby enhancing signal sensitivity.

2. The active notch filter of claim 1, said amplifier comprising a microwave amplifier.

3. The active notch filter of claim 2, said amplifier comprising a field effect transistor (FET) or a high electron mobility transistor (HEMT) amplifier.

4. The active notch filter of claim 1, wherein said PBC includes a housing that forms a waveguide cavity.

5. The active notch filter of claim 4, said housing including opposed end walls with respective antennas extending into the cavity through said walls, one of said antennas being activated by the amplifier output to transmit electromagnetic radiation into the cavity, and the other antenna producing a feedback signal for said feedback loop in response to radiation received from said cavity.

6. The active notch filter of claim 5, wherein said antennas are connected in said feedback loop by microstrip lines.

7. The active notch filter of claim 4, wherein said PBC comprises an array of spaced dielectric members that establish the PBC's frequency response.

8. The active notch filter of claim 7, wherein said dielectric members have dielectric constants that vary in response to a voltage applied across the dielectric members establish a frequency response having a passband within a stopband, further comprising electrical connectors for applying a voltage across said members to vary the location of the passband in said stopband.

9. The active notch filter of claim 7, wherein said dielectric members are in the form of rods.

10. The active notch filter of claim 7, further comprising at least one switch for interconnecting at least one pair of said dielectric members to vary the filter's frequency response.

11. The active notch filter of claim 1, in which said PBC includes at least one defect that introduces a passband within said bandgap.

12. The active notch filter of claim 1, further comprising at least one additional PBC connected in said feedback loop parallel to said first PBC.

13. The active notch filter of claim 12, wherein each additional PBC has a frequency response different from said first PBC, and further comprising a switching network for switching selected sets of said PBCs into said feedback loop to control the filter's frequency response.

14. The active notch filter of claim 12, further comprising a switching network for switching selected sets of said PBCs into said feedback loop to control the filter's frequency response.

15. The active notch filter of claim 1, said feedback loop including a difference node connected to receive the output of said PBC and an input to the filter as differential inputs, said difference node having an output connected to the amplifier input.

16. A method of filtering an electrical microwave input signal, comprising:
   obtaining the difference between said input signal and an electrical feedback signal to produce a difference signal,
   amplifying said difference signal to produce an electrical output signal, and
   generating said feedback signal by transducing said output signal into electromagnetic radiation, transmitting said radiation through a photonic bandgap crystal (PBC) having an aperiodic dispersion relation to attenuate a selected frequency band while passing the harmonic frequencies of said selected frequency band to insure stable operation, and transducing said filtered radiation back into said feedback signal,
   said feedback signal causing input signals within said selected frequency band to be simultaneously filtered and amplified thereby enhancing signal sensitivity.

17. The method of claim 16, further comprising the step of varying said selected frequency band to vary the frequencies of preferential amplification.

18. The method of claim 17, said PBC including an array of dielectric members that establish its frequency response having a passband within a stopband, further comprising the step of varying the dielectric constants of said members to vary the location of the passband in said stopband.

19. The method of claim 18, wherein said dielectric constants are varied by applying a voltage across the members that are responsible for creating the passband.

20. The method of claim 17, further comprising the step of varying the PBC through which the radiation is filtered to vary said selected frequency band.

21. The method of claim 20, wherein the PBC through which the radiation is filtered is varied by selecting among multiple parallel PBCs.

\* \* \* \* \*